(12) United States Patent
Lu

(10) Patent No.: US 11,050,969 B2
(45) Date of Patent: Jun. 29, 2021

(54) PANEL DEVICE AND MANUFACTURING METHOD THEREOF

(71) Applicant: WUHAN CHINA STAR OPTOELECTRONICS TECHNOLOGY CO., LTD., Hubei (CN)

(72) Inventor: Yantao Lu, Hubei (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 0 days.

(21) Appl. No.: 16/485,172

(22) PCT Filed: May 20, 2019

(86) PCT No.: PCT/CN2019/087598
§ 371 (c)(1),
(2) Date: Aug. 12, 2019

(87) PCT Pub. No.: WO2020/107819
PCT Pub. Date: Jun. 4, 2020

(65) Prior Publication Data
US 2020/0204756 A1    Jun. 25, 2020

(30) Foreign Application Priority Data

Nov. 28, 2018 (CN) .......................... 201811436786.6

(51) Int. Cl.
*H04N 5/66* (2006.01)
*H04N 9/12* (2006.01)
(Continued)

(52) U.S. Cl.
CPC ............. *H04N 5/70* (2013.01); *H05K 1/0393* (2013.01); *H05K 3/361* (2013.01)

(58) Field of Classification Search
CPC .......... H04N 5/70; H04N 9/31; H04N 9/3179; H04N 9/3155; H04N 5/66; H04N 9/12;
(Continued)

(56) References Cited

U.S. PATENT DOCUMENTS 8,885,350 B2 * 11/2014 Liu ................... G02F 1/133385
361/749
9,167,697 B2 * 10/2015 Kim ....................... H05K 1/181
(Continued)

*Primary Examiner* — Trang U Tran
(74) *Attorney, Agent, or Firm* — Mark M. Friedman

(57) ABSTRACT

The present invention provides a display device and a manufacturing method thereof. The display device includes a display panel, a driving chip and a flexible circuit board. The driving chip is electrically connected to the flexible circuit board and the display panel. The display panel includes a display area and a connecting area disposed on one side of the display area. The driving chip and the flexible circuit board are disposed in the connecting area, and the driving chip and the flexible circuit board at least partially overlap. By setting the driving chip and the flexible circuit boards are at least partially overlapped, which can reduce width of frame of the display device, increase screen ratio of the display device, and realize narrow frame display.

8 Claims, 6 Drawing Sheets

(51) Int. Cl.
*H04N 5/70* (2006.01)
*H05K 1/03* (2006.01)
*H05K 3/36* (2006.01)

(58) Field of Classification Search
CPC ........ H05K 1/0393; H05K 3/361; H05K 1/02;
G09G 3/36; G09G 3/34
USPC .......................................................... 348/739
See application file for complete search history.

(56) References Cited

U.S. PATENT DOCUMENTS

| | | | |
|---|---|---|---|
| 9,885,929 B2* | 2/2018 | Oh | G02F 1/13452 |
| 10,080,281 B2* | 9/2018 | Jung | H01L 51/0097 |
| 2019/0320150 A1* | 10/2019 | Lim | H01L 27/1218 |

* cited by examiner

PANEL DEVICE AND MANUFACTURING METHOD THEREOF

FIELD OF INVENTION

The present invention relates to the field of display technologies, and in particular, to a display device and a manufacturing method thereof.

BACKGROUND OF INVENTION

With development of display technologies, flat panel display devices are widely used in consumer electronic products, such as mobile phones, televisions, personal digital assistants, digital cameras, laptops, and desktops due to their high image quality, power saving, thin body and wide application range, and becoming the mainstream in display devices. Current flat display devices mainly comprise a liquid crystal display (LCD) and an organic light emitting display (OLEO).

LCD devices generally comprise a LCD panel and a backlight module. Working principle of the LCD panel is to place liquid crystal molecules in two parallel glass substrates, and to apply a voltage between the two glass substrates to control the liquid crystal molecules to change direction, and refract light of the backlight module to produce a picture.

Luminescence principle of the OLED panel is that the semiconductor material and the organic luminescent material are driven by an electric field, and the luminescence is caused by carrier injection and recombination. Specifically, the OLEO surface usually uses an ITO pixel electrode and a metal electrode as anodes and cathodes of the device, respectively. Driven by a certain voltage, electrons and holes are injected from the cathode and the anode to the electron transport layer and the hole transport layer, respectively. The electrons and holes migrate to the light-emitting layer through the electron transport layer and the hole transport layer, respectively, and meet in the light-emitting layer to form excitons and excite the light-emitting molecules, and the latter emits visible light through radiation relaxation.

Both the LCD device and the OLED device need to be driven by an external circuit. As shown in FIG. 1, a display device using a chip on glass (COG) technology comprises a display panel 100, a driving chip 200, and a flexible circuit board 300. The display panel 100 comprises an active area (AA) 101 and a connecting area 102 disposed on the lower side of the active area 101. The driving chip 200 and the flexible circuit board 300 are both disposed in the connecting area 102. The driving chip 200 is disposed between the active area 101 and the flexible circuit board 300. The driving chip 200 is electrically connected to the flexible circuit board 300 through a connection trace 201 to receive an input signal from the flexible circuit board 300 and generates a driving signal according to the input signal. Finally, the driving signal is input into the active area 101, and the active area 101 is driven to display the screen. In the display device, the driving chip 200 is electrically connected to the flexible circuit board 300 through the connection trace 201, resulting in a large width of the connecting area 102. Thus, the lower frame of the display device is large, and the screen ratio of the display device is decreased, and narrow frames and full screen display cannot be realized.

SUMMARY OF INVENTION

An object of the present invention is to provide a display device capable of reducing the width of a frame of a display device, increasing the screen ratio of the display device, and realizing a narrow bezel display.

Another object of the present invention is to provide a manufacturing method of the display device, which can reduce the size of the frame of the display device, increase the screen ratio of the display device, and realize a narrow bezel display.

In order to achieve the above object, the present invention provides a display device. The display device comprises a display panel, a driving chip, and a flexible circuit board, wherein the driving chip is electrically connected to the flexible circuit board and the display panel, and the display panel comprises a display area and a connecting area disposed on a side of the display area, both the driving chip and the flexible circuit board are disposed in the connecting area, and the driving chip at least partially overlaps the flexible circuit board.

A plurality of first pins are disposed at intervals in the connecting area;

a plurality of second pins are disposed at intervals on a side surface of the flexible circuit board away from the display panel;

a plurality of output pins are disposed on the driving chip corresponding to the first pins respectively, and a plurality of input pins are disposed on the driving chip corresponding to the second pins respectively; and the driving chip partially overlaps the flexible circuit board, each output pins is bound to one of the first pins, and each input pins is bound to one of the second pins.

A plurality of first pins are disposed at intervals in the connecting area;

a plurality of second pins are disposed at intervals on a side surface of the flexible circuit board away from the display panel, a plurality of connection vias are further formed on the flexible circuit board, the connection vias correspond to the first pins respectively, each of the connection vias passes through the flexible circuit board and correspondingly exposes one of the first pins, each of the connection vias is disposed within a connection pin, and an end of the connection pin is bound to the first pin corresponding to the connection vias;

a plurality of output pins are disposed on the driving chip corresponding to the first pins respectively, and a plurality of input pins are disposed on the driving chip corresponding to the second pins respectively; and the driving chip completely overlaps the flexible circuit board, each output pins is correspondingly bound to the other end of the connection pin, and each input pins is bound to one of the second pins.

The connecting area is disposed on the lower side of the display area.

The driving chip is a driving chip with an in cell touch function.

The present invention further provides a manufacturing method of a display device. The manufacturing method of the display device comprises the following steps:

step S1. providing a display panel, wherein the display panel comprises a display area and a connecting area disposed on a side of the display area;

step S2. providing a flexible circuit board and disposing the flexible circuit board in the connecting area; and step S3. providing a driving chip and disposing the driving chip in the connecting area, wherein the driving chip is electrically connected to the flexible circuit board and the display panel, and the driving chip at least partially overlaps the flexible circuit board.

The step S1 further comprises: forming a plurality of first pins disposed at intervals in the connecting area;

the step S2 further comprises: forming a plurality of second pins disposed at intervals on a side surface of the flexible circuit board away from the display panel;

the driving chip provided by the step 3 is disposed with a plurality of output pins corresponding to the first pins respectively, and a plurality of input pins corresponding to the second pins respectively; and the step S3 further comprises: disposing the driving chip partially overlapping the flexible circuit board, each output pins is bound to one of the first pins, and each input pins is bound to one of the second pins.

The step S1 further comprises: forming a plurality of first pins disposed at intervals in the connecting area:

the step S2 further comprises:

forming a plurality of second pins disposed at intervals on a side surface of the flexible circuit board away from the display panel;

forming a plurality of connection vias on the flexible circuit board, wherein the connection vias correspond to the first pins respectively, each of the connection vias passes through the flexible circuit board and correspondingly exposes one of the first pins;

each of the connection vias is disposed within a connection pin, and an end of the connection pin is bound to the first pin corresponding to the connection vias;

the driving chip provided by the step 3 is disposed with a plurality of output pins corresponding to the first pins respectively, and a plurality of input pins corresponding to the second pins respectively; and the step S3 further comprises: disposing the driving chip partially overlapping the flexible circuit board, each output pins is bound to the other end of the connection pin, and each input pins is bound to one of the second pins.

The connecting area is disposed on the lower side of the display area.

The driving chip is a driving chip with an in cell touch function.

The beneficial effects of the invention: the present invention provides a display device comprising a display panel, a driving chip and a flexible circuit board. The driving chip is electrically connected to the flexible circuit board and the display panel. The display panel comprises a display area and a connecting area disposed on one side of the display area. The driving chip and the flexible circuit board are disposed in the connecting area, and the driving chip at least partially overlaps the flexible circuit board. By setting the driving chip at least partially overlaps the flexible circuit board, which can reduce the width of the frame of the display device, increase the screen ratio of the display device, and realize narrow frame display. The present invention further provides a manufacturing method of a display device, which can reduce the width of the frame of the display device, increase the screen ratio of the display device, and realize narrow frame display.

DESCRIPTION OF DRAWINGS

In order to further understand the features and technical details of the present invention, please refer to the following detailed description and drawings regarding the present invention. The drawings are provided for reference and description only and are not intended to limit the present invention.

In the drawings.

DETAILED DESCRIPTION OF PREFERRED EMBODIMENTS

Figure 1:
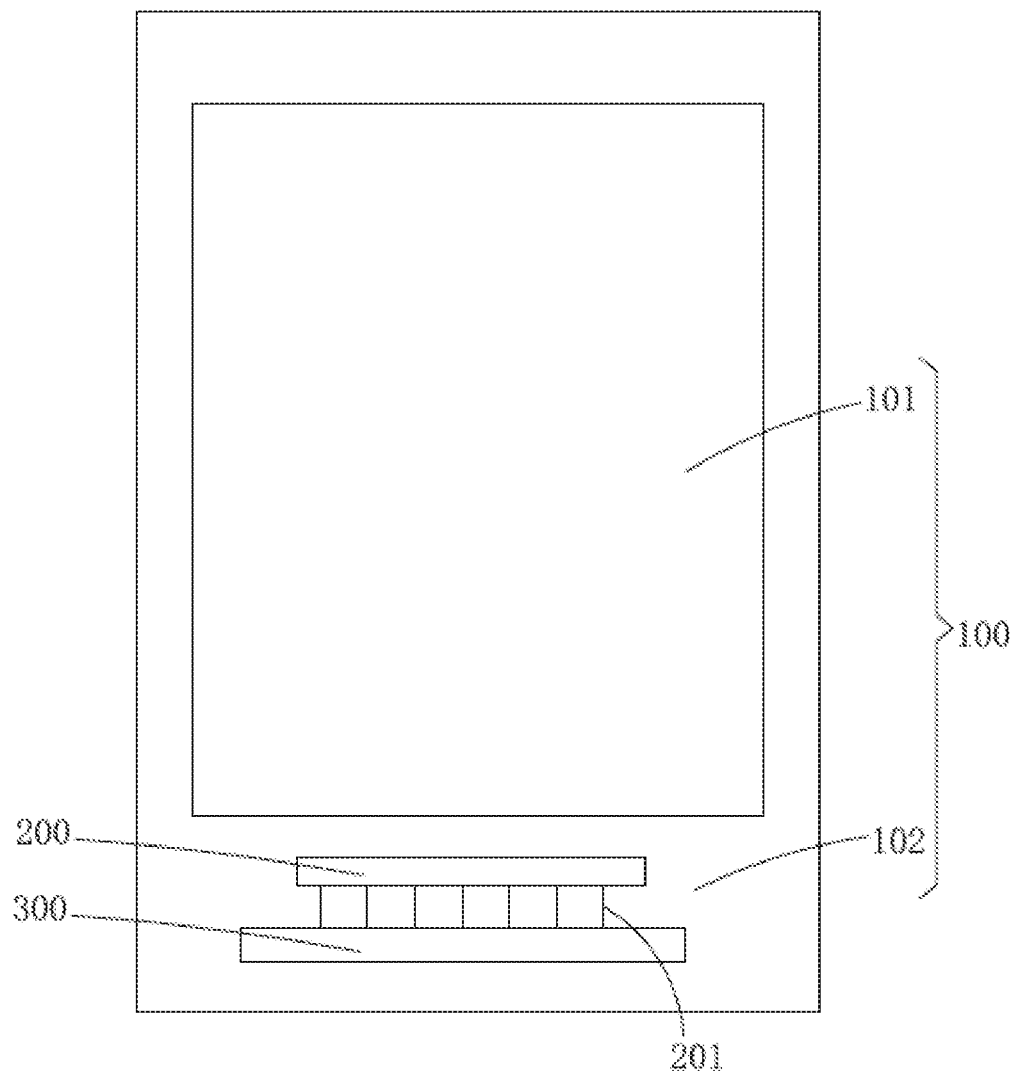
FIG. 1 is a structural view of a conventional display device.

In order to further clarify the technical means and effects of the present invention, the following detailed description will be made in conjunction with the preferred embodiments of the invention and the accompanying drawings.

Please refer to FIG. 2 to FIG. 5, the present invention provides a display device comprising a display panel 1, a driving chip 2, and a flexible circuit board 3. The driving chip 2 is electrically connected to the flexible circuit board 3 and the display panel 1.

The display panel 1 comprises a display area 11 and a connecting area 12 disposed on a side of the display area 11. Both the driving chip 2 and the flexible circuit board 3 are disposed in the connecting area 12, and the driving chip 2 at least partially overlaps the flexible circuit board 3.

Figure 2:
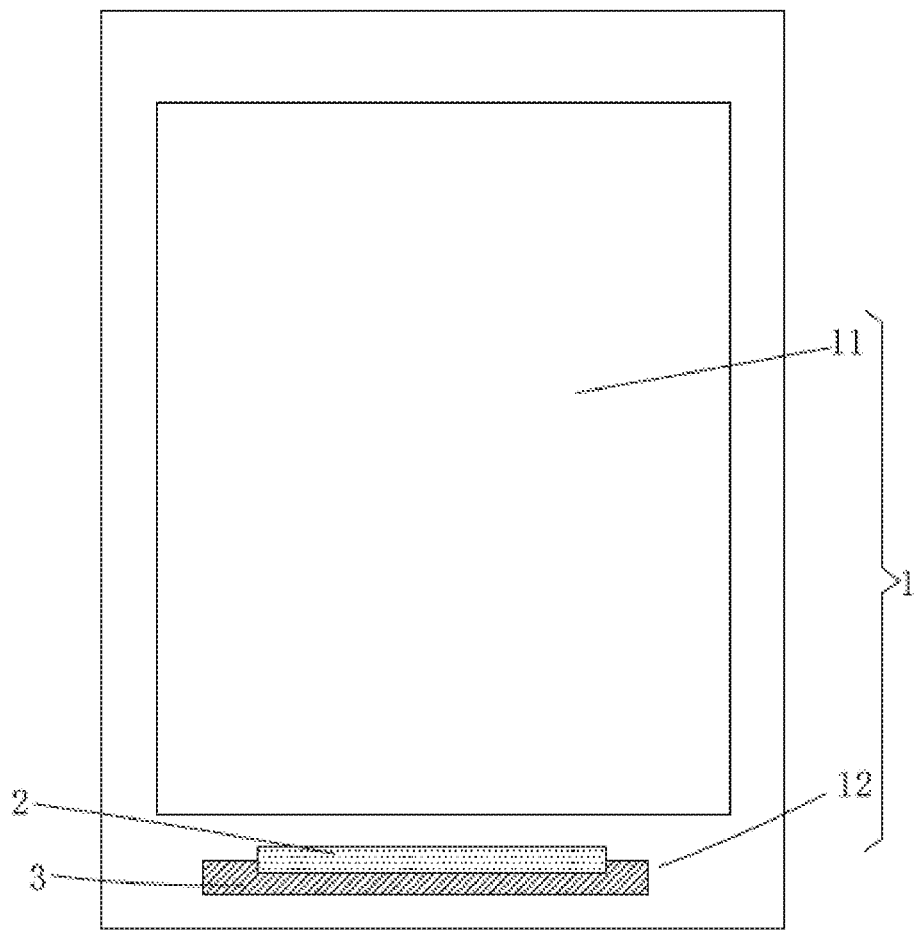
FIG. 2 is a structural view showing a first embodiment of a display device of the present invention.
Figure 3:
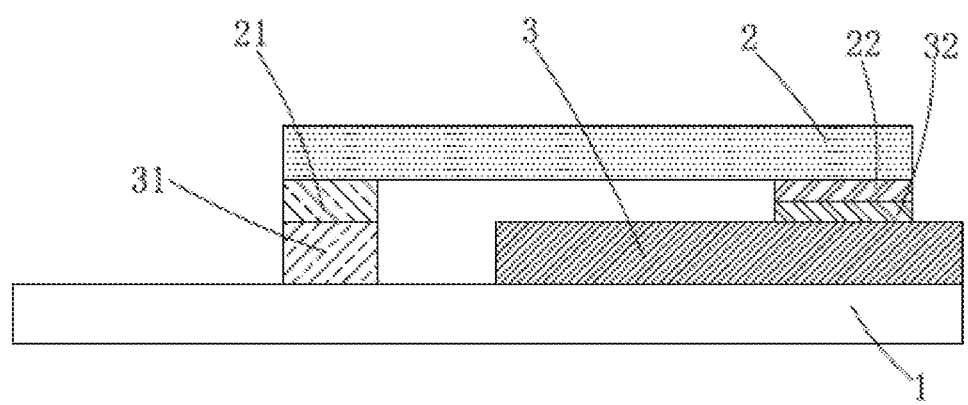
FIG. 3 is a cross-sectional view taken along line A-A of FIG. 2.

Specifically, as shown in FIGS. 2 and 3, in the first embodiment of the present invention, a plurality of first pins 31 are disposed at intervals in the connecting area 12. A plurality of second pins 32 are disposed at intervals on a side surface of the flexible circuit board 3 away from the display panel 1. A plurality of output pins 21 are disposed on the driving chip 2 corresponding to the first pins 31 respectively, and a plurality of input pins 22 are disposed on the driving chip 2 corresponding to the second pins respectively 32. The driving chip 2 partially overlaps the flexible circuit board 3, each output pins 21 is bound to one of the first pins 31, and each input pins 22 is bound to one of the second pins 32.

Further, in the first embodiment of the present invention, the electrical connection between the flexible circuit board 3 and the driving chip 2 is realized through connecting the second pin 32 and the input pin 22, thereby transmitting an input signal to the driving chip 2 through the flexible circuit board 3. The electrical connection between the driving chip 2 and the display panel 1 is realized through connecting the first pin 31 and the output pin 21, so that the driving chip 2 transmits a driving signal to the display panel 1 to drive the display panel 1 to work.

Further, a display circuit is disposed in the display area 11, and the first pin 31 is electrically connected to the display circuit, thereby transmitting the driving signal to the display panel 1.

Figure 4:
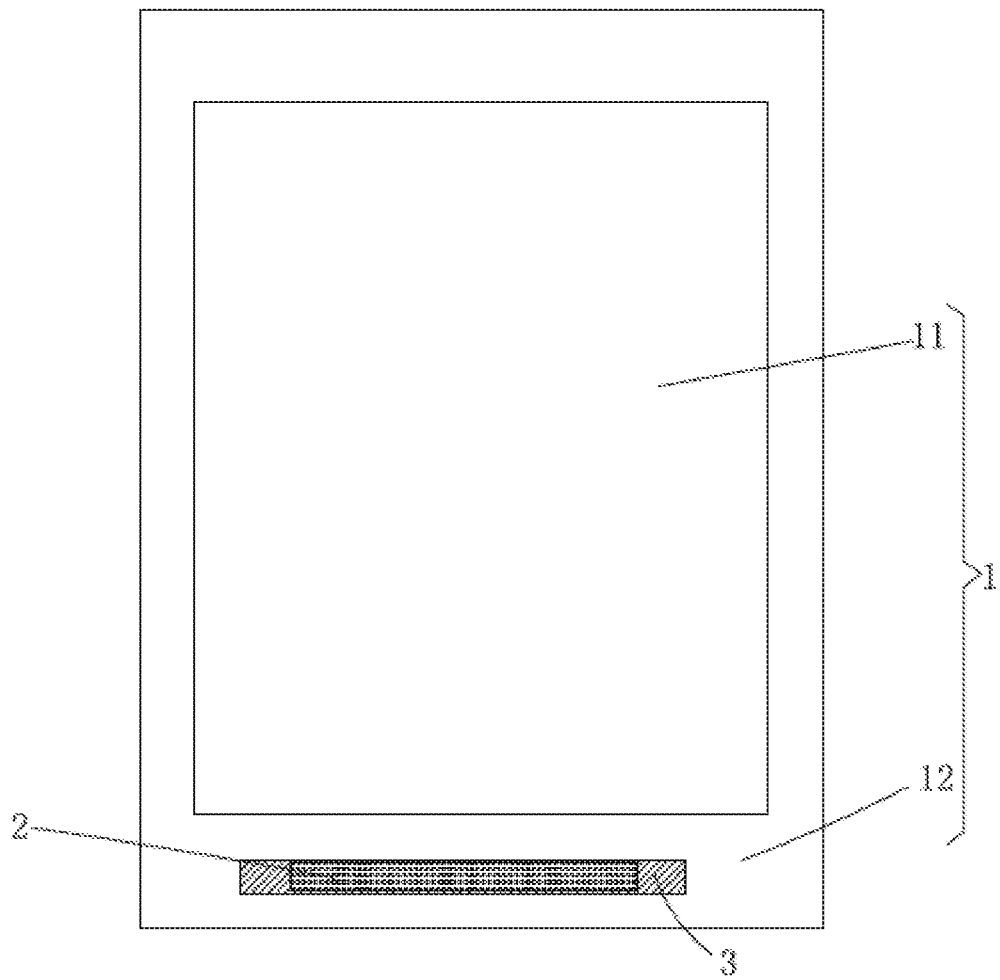
FIG. 4 is a structural view showing a second embodiment of the display device of the present invention.
Figure 5:
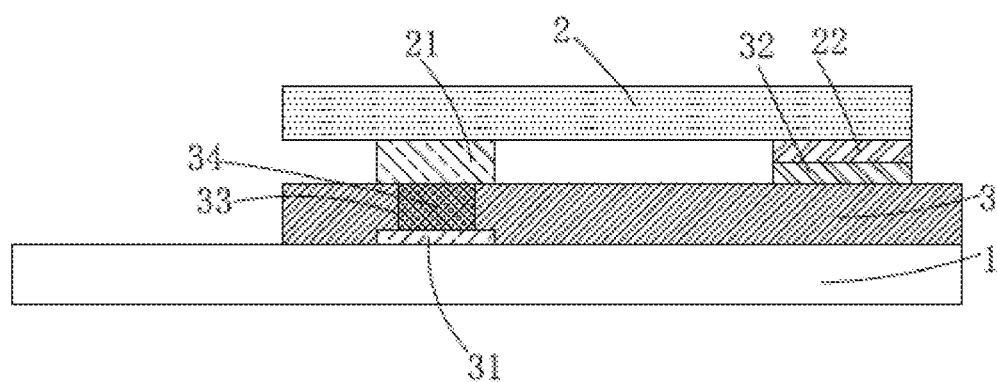
FIG. 5 is a cross-sectional view taken along line B-B of FIG. 4.

Specifically, as shown in FIG. 4 and FIG. 5, in the second embodiment of the present invention, a plurality of first pins 31 are disposed at intervals in the connecting area 12. A plurality of second pins 32 are disposed at intervals on a side surface of the flexible circuit board 3 away from the display panel 1. A plurality of connection vias 33 are further formed on the flexible circuit board 3, and the connection vias 33 correspond to the first pins 31 respectively. Each of the connection vias 33 passes through the flexible circuit board 3 and correspondingly exposes one of the first pins 31. Each of the connection vias 33 is disposed within a connection pin 34, and an end of the connection pin 34 is bound to the first pin 31 corresponding to the connection vias 33. A plurality of output pins 21 are disposed on the driving chip 2 corresponding to the connection pins 34 respectively, and a plurality of input pins 22 are disposed on the driving chip 2 corresponding to the second pins 32 respectively. The driving chip 2 completely overlaps the flexible circuit board 3. Each output pins 21 is correspondingly bound to the other end of the connection pin 34, and each input pins 22 is bound to one of the second pins 32.

Further, in the second embodiment of the present invention, the electrical connection between the flexible circuit board 3 and the driving chip 2 is realized through connecting the second pin 32 and the input pin 22, thereby transmitting an input signal to the driving chip 2 through the flexible circuit board 3. The electrical connection between the driving chip 2 and the display panel 1 is realized through connecting the first pin 31 and the connection pin 34, and through connecting the connection pin 34 and the output pin 21, so that the driving chip 2 transmits a driving signal to the display panel 1 to drive the display panel 1 to work.

Further, in the second embodiment of the present invention, a display circuit is disposed in the display area 11, and the first pin 31 is electrically connected to the display circuit, thereby transmitting the driving signal to the display panel 1.

Further, in the second embodiment of the present invention, the connection pin 34 has a larger area at both ends, which have a pad shape. The middle of the connection pin 34 is a connecting line that passes through the connection via 33 to facilitate the bonding of the connection pin 34 to the first pin 31 and the output pin 21.

Specifically, the connecting area 12 is disposed on the lower side of the display area 11. That is, the width of the connecting area 12 determines the width of the lower frame of the display device. In the present invention, the driving chip 2 at least partially overlapping the flexible circuit board 3 can reduce the width of the connecting area 12. Thus, the width of the lower frame of the display device is reduced by 650 μm or more, the screen ratio of the display device is increased, and a narrow bezel display is realized.

Specifically, the driving chip is a driving chip with an in cell touch function.

Specifically, the display panel 1 is a LCD panel or an OLED panel.

Figure 6:
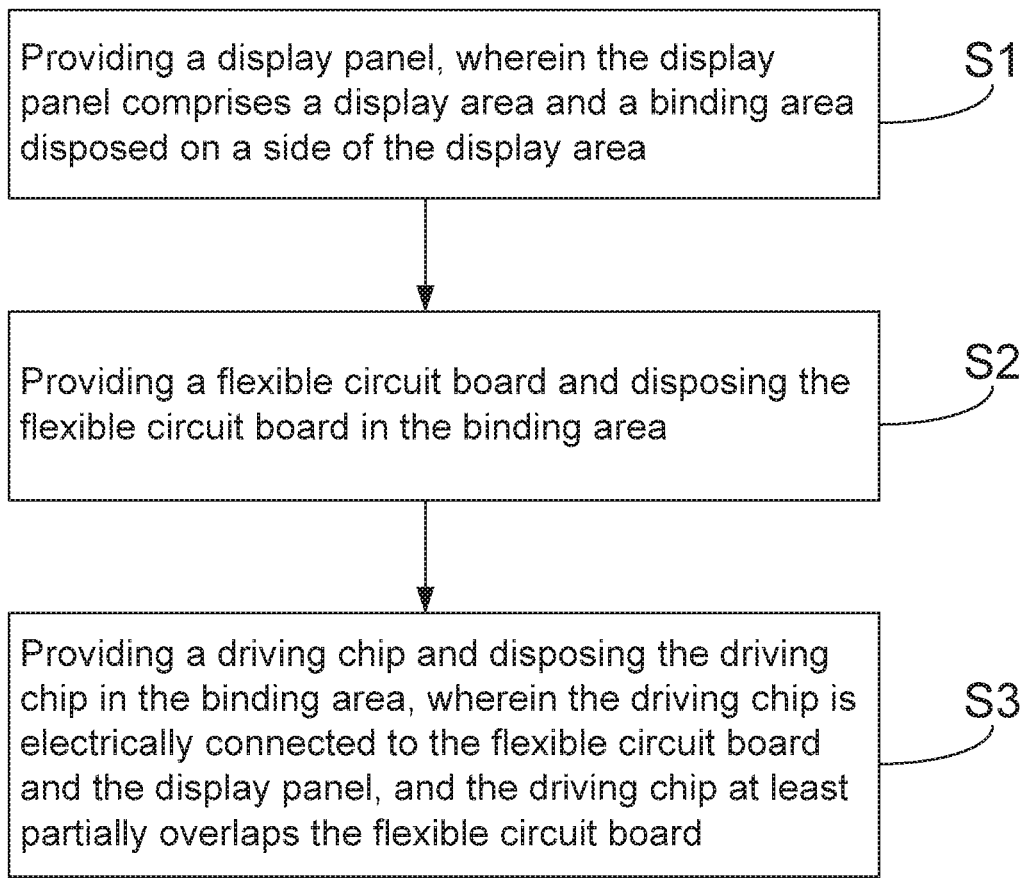
FIG. 6 is a flow chart of a manufacturing method of the display device of the present invention.

Referring to FIG. 6, the present invention further provides a manufacturing method of a display device. The manufacturing method of the display device comprises the following steps:

Step S1. providing a display panel 1. The display panel 1 comprises a display area 11 and a connecting area 12 disposed on a side of the display area 11.

Specifically, the connecting area 12 is dispose on the lower side of the display area 11. That is, the width of the connecting area 12 determines the width of the lower frame of the display device.

Specifically, the driving chip is a driving chip with an in cell touch function.

Specifically, the display panel 1 is a LCD panel or an OLED panel.

Specifically, in the first and second embodiments of the present invention, the step S1 further comprises: forming a plurality of first pins 31 disposed at intervals in the connecting area 12.

Step S2. providing a flexible circuit board 3 and disposing the flexible circuit board 3 in the connecting area 12.

Specifically, in the first embodiment of the present invention, the step S2 further comprises: forming a plurality of second pins 32 disposed at intervals on a side surface of the flexible circuit board 3 away from the display panel 1.

Specifically, in the second embodiment of the present invention, the step S2 further comprises: forming a plurality of second pins 32 disposed at intervals on a side surface of the flexible circuit board 3 away from the display panel 1.

A plurality of connection vias 33 are formed on the flexible circuit board 3, wherein the connection vias 33 correspond to the first pins 31 respectively, each of the connection vias 33 passes through the flexible circuit board 3 and correspondingly exposes one of the first pins 31.

Each of the connection vias 33 is disposed within a connection pin 34, and an end of the connection pin 34 is bound to the first pin 31 corresponding to the connection vias 33.

Step S3. providing a driving chip 2 and disposing the driving chip 2 in the connecting area 12. The driving chip 2 is electrically connected to the flexible circuit board 3 and the display panel 1, and the driving chip 2 at least partially overlaps the flexible circuit board 3.

Specifically, in the first embodiment of the present invention, the driving chip 2 provided by the step 3 is disposed with a plurality of output pins 21 corresponding to the first pins 31 respectively, and a plurality of input pins 22 corresponding to the second pins 32 respectively.

Specifically, in the first embodiment of the present invention, the step S3 further comprises: disposing the driving chip 2 partially overlapping the flexible circuit board 3, each output pins 21 is bound to one of the first pins 31, and each input pins 22 is bound to one of the second pins 32.

Specifically, in the second embodiment of the present invention, the driving chip 2 provided by the step 3 is disposed with a plurality of output pins 21 corresponding to the connection pins 34 respectively, and a plurality of input pins 22 corresponding to the second pins 32 respectively.

Specifically, in the second embodiment of the present invention, the step S3 further comprises: disposing the driving chip 2 completely overlapping the flexible circuit board 3, each output pins 21 is bound to one of the connection pins 34, and each input pins 22 is bound to one of the second pins 32.

Thus, in the first embodiment of the present invention, the electrical connection between the flexible circuit board 3 and the driving chip 2 is realized through connecting the second pin 32 and the input pin 22, thereby transmitting an input signal to the driving chip 2 through the flexible circuit board 3. The electrical connection between the driving chip 2 and the display panel 1 is realized through connecting the first pin 31 and the output pin 21, so that the driving chip 2 transmits a driving signal to the display panel 1 to drive the display panel 1 to work.

Further, a display circuit is disposed in the display area 11, and the first pin 31 is electrically connected to the display circuit, thereby transmitting the driving signal to the display panel 1.

Thus, in the second embodiment of the present invention, the electrical connection between the flexible circuit board 3 and the driving chip 2 is realized through connecting the second pin 32 and the input pin 22, thereby transmitting an input signal to the driving chip 2 through the flexible circuit board 3. The electrical connection between the driving chip 2 and the display panel 1 is realized through connecting the first pin 31 and the connection pin 34, and through connecting the connection pin 34 and the output pin 21, so that the driving chip 2 transmits a driving signal to the display panel 1 to drive the display panel 1 to work.

Further, in the second embodiment of the present invention, a display circuit is disposed in the display area 11, and the first pin 31 is electrically connected to the display circuit, thereby transmitting the driving signal to the display panel 1.

Further, in the second embodiment of the present invention, the connection pin 34 has a larger area at both ends, which have a pad shape. The middle of the connection pin 34 is a connecting line that passes through the connection via 33 to facilitate the bonding of the connection pin 34 to the first pin 31 and the output pin 21.

In the present invention, the driving chip 2 at least partially overlapping the flexible circuit board 3 can reduce the width of the connecting area 12. Thus, the width of the lower frame of the display device is reduced by 650 μm or more, the screen ratio of the display device is increased, and a narrow bezel display is realized.

In summary, the present invention provides a display device comprising a display panel, a driving chip and a flexible circuit board. The driving chip is electrically connected to the flexible circuit board and the display panel. The display panel comprises a display area and a connecting area disposed on one side of the display area. The driving chip and the flexible circuit board are disposed in the connecting area, and the driving chip at least partially overlaps the flexible circuit board. By setting the driving chip at least partially overlaps the flexible circuit board, which can reduce the width of the frame of the display device, increase the screen ratio of the display device, and realize narrow frame display. The present invention further provides a manufacturing method of a display device, which can reduce the width of the frame of the display device, increase the screen ratio of the display device, and realize narrow frame display.

In the above, various other corresponding changes and modifications can be made according to the technical solutions and technical ideas of the present invention to people skilled in the art, and all such changes and modifications are within the scope of the claims of the present invention.

What is claimed is:

1. A display device, comprising: a display panel, a driving chip, and a flexible circuit board, wherein the driving chip is electrically connected to the flexible circuit board and the display panel, and
the display panel comprises a display area and a connecting area disposed on a side of the display area, both the driving chip and the flexible circuit board are disposed in the connecting area, and the driving chip at least partially overlaps the flexible circuit board;
wherein a plurality of first pins are disposed at intervals in the connecting area;
a plurality of second pins are disposed at intervals on a side surface of the flexible circuit board away from the display panel;
a plurality of output pins are disposed on the driving chip corresponding to the first pins respectively, and a plurality of input pins are disposed on the driving chip corresponding to the second pins respectively; and
the driving chip partially overlaps the flexible circuit board, each of the output pins is bound to one of the first pins, and each of the input pins is bound to one of the second pins.

2. The display device as claimed in claim 1, wherein a plurality of first pins are disposed at intervals in the connecting area;
a plurality of second pins are disposed at intervals on a side surface of the flexible circuit board away from the display panel, a plurality of connection vias are further formed on the flexible circuit board, the connection vias correspond to the first pins respectively, each of the connection vias passes through the flexible circuit board and correspondingly exposes one of the first pins, each of the connection vias is disposed within a connection pin, and an end of the connection pin is bound to the first pin corresponding to the connection vias;
a plurality of output pins are disposed on the driving chip corresponding to the first pins respectively, and a plurality of input pins are disposed on the driving chip corresponding to the second pins respectively; and
the driving chip completely overlaps the flexible circuit board, each output pins is correspondingly bound to the other end of the connection pin, and each input pins is bound to one of the second pins.

3. The display device as claimed in claim 1, wherein the connecting area is disposed on a lower side of the display area.

4. The display device as claimed in claim 1, wherein the driving chip is a driving chip with an in cell touch function.

5. A manufacturing method of a display device, comprising the following steps:
step S1. providing a display panel, wherein the display panel comprises a display area and a connecting area disposed on a side of the display area;
step S2. providing a flexible circuit board and disposing the flexible circuit board in the connecting area; and
step S3. providing a driving chip and disposing the driving chip in the connecting area, wherein the driving chip is electrically connected to the flexible circuit board and the display panel, and the driving chip at least partially overlaps the flexible circuit board;
wherein the step S1 further comprises: forming a plurality of first pins disposed at intervals in the connecting area;
the step S2 further comprises: forming a plurality of second pins disposed at intervals on a side surface of the flexible circuit board away from the display panel; and
the step S3 further comprises: disposing the driving chip with a plurality of output pins corresponding to the first pins respectively, and a plurality of input pins corresponding to the second pins respectively; and
disposing the driving chip partially overlapping the flexible circuit board, each of the output pins is bound to one of the first pins, and each of the input pins is bound to one of the second pins.

6. The manufacturing method of the display device as claimed in claim 5, wherein the step S1 further comprises: forming a plurality of first pins disposed at intervals in the connecting area:
the step S2 further comprises:
forming a plurality of second pins disposed at intervals on a side surface of the flexible circuit board away from the display panel;
forming a plurality of connection vias on the flexible circuit board, wherein the connection vias correspond to the first pins respectively, each of the connection vias passes through the flexible circuit board and correspondingly exposes one of the first pins;
each of the connection vias is disposed within a connection pin, and an end of the connection pin is bound to the first pin corresponding to the connection vias;
the driving chip provided by the step 3 is disposed with a plurality of output pins corresponding to the first pins respectively, and a plurality of input pins corresponding to the second pins respectively; and the step S3 further comprises: disposing the driving chip partially overlapping the flexible circuit board, each output pins is bound to the other end of the connection pin, and each input pins is bound to one of the second pins.

7. The manufacturing method of the display device as claimed in claim 5, wherein the connecting area is disposed on a lower side of the display area.

8. The manufacturing method of the display device as claimed in claim 5, wherein the driving chip is a driving chip with an in cell touch function.

\* \* \* \* \*